US011926698B2

(12) United States Patent
Tu et al.

(10) Patent No.: US 11,926,698 B2
(45) Date of Patent: *Mar. 12, 2024

(54) LIQUID CRYSTAL POLYMER FILM AND LAMINATE COMPRISING THE SAME

(71) Applicant: Chang Chun Plastics Co., Ltd., Taipei (TW)

(72) Inventors: An-Pang Tu, Taipei (TW); Chia-Hung Wu, Taipei (TW); Chien-Chun Chen, Taipei (TW)

(73) Assignee: CHANG CHUN PLASTICS CO., LTD., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/126,446

(22) Filed: Dec. 18, 2020

(65) Prior Publication Data

US 2021/0189118 A1    Jun. 24, 2021

Related U.S. Application Data

(60) Provisional application No. 62/952,553, filed on Dec. 23, 2019.

(51) Int. Cl.
| | | |
|---|---|---|
| *B32B 27/36* | (2006.01) | |
| *B29C 41/12* | (2006.01) | |
| *B29D 7/01* | (2006.01) | |
| *B32B 15/09* | (2006.01) | |
| *B32B 15/20* | (2006.01) | |
| *C08G 63/06* | (2006.01) | |
| *C08G 63/60* | (2006.01) | |
| *C08G 63/83* | (2006.01) | |
| *C08J 5/18* | (2006.01) | |
| *C08L 67/04* | (2006.01) | |
| *C09K 19/38* | (2006.01) | |
| *H05K 1/03* | (2006.01) | |
| *B29K 67/00* | (2006.01) | |
| *B29K 105/00* | (2006.01) | |

(52) U.S. Cl.
CPC ............ *C08G 63/065* (2013.01); *B29C 41/12* (2013.01); *B29D 7/01* (2013.01); *B32B 15/09* (2013.01); *B32B 15/20* (2013.01); *B32B 27/36* (2013.01); *C08G 63/06* (2013.01); *C08G 63/60* (2013.01); *C08G 63/83* (2013.01); *C08J 5/18* (2013.01); *C08L 67/04* (2013.01); *C09K 19/3809* (2013.01); *H05K 1/032* (2013.01); *B29K 2067/00* (2013.01); *B29K 2105/0079* (2013.01); *B32B 2250/03* (2013.01); *B32B 2250/40* (2013.01); *B32B 2305/55* (2013.01); *B32B 2307/538* (2013.01); *B32B 2307/704* (2013.01); *B32B 2307/732* (2013.01); *B32B 2457/08* (2013.01); *C08G 2250/00* (2013.01); *C08J 2367/04* (2013.01); *C08L 2203/16* (2013.01); *H05K 2201/0141* (2013.01)

(58) Field of Classification Search
None
See application file for complete search history.

(56) References Cited

U.S. PATENT DOCUMENTS

| | | | |
|---|---|---|---|
| 5,534,209 A | 7/1996 | Moriya | |
| 5,746,949 A | 5/1998 | Shen et al. | |
| 5,998,804 A | 12/1999 | Suh et al. | |
| 6,859,241 B2 | 2/2005 | Hamamoto | |
| 9,874,439 B2 | 1/2018 | Bucher | |
| 2002/0060309 A1 | 5/2002 | Jester | |
| 2006/0048963 A1 | 3/2006 | Nishinaka et al. | |
| 2009/0033839 A1 | 2/2009 | Fukuda | |
| 2014/0135469 A1 | 5/2014 | Kim et al. | |
| 2017/0347464 A1* | 11/2017 | Hashizume | .......... H05K 1/0298 |
| 2018/0147815 A1* | 5/2018 | Hashizume | ............. B32B 27/34 |
| 2018/0230317 A1 | 8/2018 | Seo | |
| 2019/0091970 A1* | 3/2019 | Ueki | ..................... B32B 27/365 |
| 2019/0160728 A1 | 5/2019 | Higashioji | |
| 2019/0352456 A1 | 11/2019 | Hsiang et al. | |
| 2020/0407639 A1* | 12/2020 | Liao | ....................... B32B 37/10 |
| 2021/0187884 A1 | 6/2021 | Tu | |
| 2021/0189118 A1 | 6/2021 | Tu | |
| 2021/0189242 A1 | 6/2021 | Tu | |

FOREIGN PATENT DOCUMENTS

| | | |
|---|---|---|
| CN | 1235173 A | 11/1999 |
| CN | 101423652 A | 5/2009 |
| CN | 101921469 A | 12/2010 |
| CN | 102085708 A | 6/2011 |
| CN | 10257436 A | 7/2012 |
| CN | 103069933 A | 4/2013 |
| CN | 109180979 A | 1/2019 |

(Continued)

OTHER PUBLICATIONS

Taiwan Examination Report of related TW 109117530 (dated May 24, 2021).
Taiwan Notice of Allowance of related TW 109117530 (dated Aug. 6, 2021).
Japan Statement of Opposition of related JP 6804673 (receiving date: Jul. 16, 2021).
Korea Statement of Opposition of related KR 10-2197515 (receiving date: Aug. 6, 2021).
Author MISUMI Co., title: Misumi-vona technical report, URL:https://jp.misumi-ec.com/tech-info/categories/technical_data/td01/g0103.html (upload date: Mar. 6, 2021).
Examination Report of JP2020-199487 (dated Aug. 26, 2021).
Examination Report of JP2020-210267(dated Oct. 8, 2021).
Examination Report of JP2020-210276(dated Oct. 14, 2021).

(Continued)

*Primary Examiner* — Seth Dumbris
(74) *Attorney, Agent, or Firm* — WPAT, P.C.

(57) ABSTRACT

Provided are a liquid crystal polymer film (LCP film) and a laminate comprising the same. The LCP film has a first surface and a second surface opposite each other, and the first surface has an arithmetical mean height of a surface (Sa) less than 0.32 μm. The LCP film with proper Sa is suitable to be stacked with a metal foil, such that a laminate comprising the LCP film can have an advantage of low insertion loss.

13 Claims, No Drawings

(56) References Cited

FOREIGN PATENT DOCUMENTS

| | | |
|---|---|---|
| CN | 109196716 A | 1/2019 |
| CN | 110073282 A | 7/2019 |
| CN | 112586096 A | 3/2021 |
| CN | 115768820 A | 3/2023 |
| EP | 3424703 A1 | 1/2019 |
| JP | S59157115 A | 9/1984 |
| JP | H0317156 A | 1/1991 |
| JP | H05-214253 A | 8/1993 |
| JP | H06-240019 A | 8/1994 |
| JP | H07-251438 A | 10/1995 |
| JP | H08-090570 A | 4/1996 |
| JP | H08-281817 A | 10/1996 |
| JP | 2587510 B2 | 3/1997 |
| JP | 2962459 B2 | 10/1999 |
| JP | 2000006351 A | 1/2000 |
| JP | 2000044797 A | 2/2000 |
| JP | 2003-340918 A | 12/2003 |
| JP | 2004-323663 A | 11/2004 |
| JP | 2005-297405 A | 10/2005 |
| JP | 2006-001185 A | 1/2006 |
| JP | 2006-249159 A | 9/2006 |
| JP | 3896324 B2 | 3/2007 |
| JP | 2007-092036 A | 4/2007 |
| JP | 2007-126578 A | 5/2007 |
| JP | 2007-217579 A | 8/2007 |
| JP | 2007203702 A | 8/2007 |
| JP | 4091209 B2 | 5/2008 |
| JP | 2008-221488 A | 9/2008 |
| JP | 2008-291168 A | 12/2008 |
| JP | 10-2009-0077767 A | 7/2009 |
| JP | 2009164596 A * | 7/2009 |
| JP | 2010-076295 A | 4/2010 |
| JP | 2010147442 A | 7/2010 |
| JP | 2011-5803 A | 1/2011 |
| JP | 2011054945 A | 3/2011 |
| JP | 2011071815 A | 4/2011 |
| JP | 2011-216598 A | 10/2011 |
| JP | 2012089608 A | 5/2012 |
| JP | 10-2012-0074230 A | 7/2012 |
| JP | 2012-167224 A | 9/2012 |
| JP | 2012-186453 A | 9/2012 |
| JP | 2012169598 A | 9/2012 |
| JP | 2013155415 A | 8/2013 |
| JP | 2013158935 A | 8/2013 |
| JP | 2014060449 A | 4/2014 |
| JP | 2014208438 A | 11/2014 |
| JP | 2015066910 A | 4/2015 |
| JP | 2015077783 A | 4/2015 |
| JP | 2016084528 A | 5/2016 |
| JP | 2016-107505 A | 6/2016 |
| JP | 2016129949 A | 7/2016 |
| JP | 2016131193 A | 7/2016 |
| JP | 2016537514 A | 12/2016 |
| JP | 2017-031442 A | 2/2017 |
| JP | 2017-135216 A | 8/2017 |
| JP | 10-2017-0103835 A | 9/2017 |
| JP | 2017189894 A | 10/2017 |
| JP | 6277576 B2 | 2/2018 |
| JP | 2018028147 A | 2/2018 |
| JP | 2018-121085 A | 8/2018 |
| JP | 2018-172785 A | 11/2018 |
| JP | 2018168409 A | 11/2018 |
| JP | 2018172790 A | 11/2018 |
| JP | 2019-043980 A | 3/2019 |
| JP | 2019117414 A | 7/2019 |
| JP | 2019123255 A | 7/2019 |
| JP | 2019-135301 A | 8/2019 |
| JP | 2019152853 A | 9/2019 |
| JP | 2022508617 A | 1/2022 |
| KR | 20050043649 A | 5/2005 |
| KR | 20110103068 A | 9/2011 |
| KR | 2016-0065942 A | 6/2016 |
| TW | 201417646 A | 5/2014 |
| TW | 201533280 A | 9/2015 |
| TW | 201928029 A | 7/2019 |
| TW | 201939077 A | 10/2019 |
| TW | 201941933 A | 11/2019 |
| TW | I697549 B | 7/2020 |
| WO | WO2010093009 A1 | 8/2010 |
| WO | WO2010139053 A | 12/2010 |
| WO | 2011111826 A1 | 9/2011 |
| WO | 2011118449 A1 | 9/2011 |
| WO | 2012/117850 A1 | 9/2012 |
| WO | WO2013021893 A1 | 2/2013 |
| WO | WO-2013108563 A1 * | 7/2013 ............ B32B 27/00 |
| WO | 2014046014 A1 | 3/2014 |
| WO | 2016104420 A | 6/2016 |
| WO | WO2016136537 A | 9/2016 |
| WO | WO2016159060 A1 | 10/2016 |
| WO | WO2016170779 A1 | 10/2016 |
| WO | WO2016174868 A1 | 11/2016 |
| WO | 2016194964 A | 12/2016 |
| WO | 2018/181223 A1 | 10/2018 |
| WO | 2018/186223 A1 | 10/2018 |
| WO | WO2018181222 A1 | 10/2018 |
| WO | 2020009230 A1 | 1/2020 |
| WO | 2020149324 A1 | 7/2020 |
| WO | WO2020156181 A1 | 8/2020 |
| WO | 2021256491 A1 | 12/2021 |

OTHER PUBLICATIONS

Third Party Observation of JP2020-210276(receiving date: Oct. 20, 2021).
Notice of Panel Decision from Pre-Appeal Brief Review of U.S. Appl. No. 16/748,846(dated Sep. 17, 2021).
Examination Report of JP2020-166621(dated Nov. 5, 2021).
Third Party Observation of JP2020-166621(receiving date: Oct. 28, 2021).
IPAB Decision on Appeal of KR10-2020-0044558 (dated May 17, 2022).
Final Examination Report of KR10-2020-0180073 (dated Apr. 28, 2022).
Examination Report of KR10-2020-0128117 (dated Jun. 22, 2022).
Examination Report of U.S. Appl. No. 16/748,846 (dated May 17, 2022).
Third Party Observation of JP2020-210284 (receiving date: May 23, 2022).
Resilience Brother, 5G communication material—liquid crystal polymer LCP (2020), Text/Meter Polymer.
Hajnys et al. Quality of Surface Texture (2021) Polymers, MDPI.
Recent Market and Application Development of Liquid Crystal Polymers (2003).
Wang, Synthesis and Self-assembled Nanostructures of Rectangular Liquid Crystals (2007) National Chiao Tung Unversity, Taiwan.
Technologies & Applications of LCP (2004).
Vecstar catalog, Kuraray Co. Ltd. (2012), Japan.
Tanaka et al. LCP material for LSI Mounting (1999).
6-hydroxy-2-naphthoic acid, Tcichemicals.com, Japan.
4-hydroxybenzoic acid, Wikipedia.
Okamoto et al. Newly developed LCP film (2005), Sumitomo Chemical Co. Ltd., Japan.
Examination Report of JP2020-021487 dated Jul. 28, 2020.
Notice of Allowance of JP2020-021487 dated Nov. 4, 2020.
Examination Report of KR10-2020-0044558 dated Jun. 29, 2020.
Notice of Allowance of KR10-2020-0044558 dated Nov. 24, 2020.
Examination Report of U.S. Appl. No. 16/748,846 dated Sep. 10, 2020.
Final Rejection of U.S. Appl. No. 16/748,846 dated Dec. 9, 2020.
Rejection of RCE of U.S. Appl. No. 16/748,846 issue on Apr. 2, 2021.
Examination Report of TW108147226 dated Mar. 13, 2020.
Notice of Allowance of TW108147226 dated May 19, 2020.
Examination Report of TW109144672 dated Feb. 23, 2021.
Examination Report of TW109144673 dated Mar. 23, 2021.
Examination Report of TW109144674 dated Feb. 25, 2021.
Authors: MahaA Mekkawyet al.; Title: Comparative study of surface roughness between polyamide, thermoplastic polymethyl

(56) References Cited

OTHER PUBLICATIONS methacrylate and acetal resins flexible denture base materials before and after polishing; Published Date: Oct. 7, 2015.
Examination Report of KR10-2020-0180055 (dated Dec. 10, 2021).
Examination Report of KR10-2020-0128117 (dated Dec. 22, 2021).
Examination Report of KR10-2020-0180073 (dated Dec. 29, 2021).
Vlachopoulos J., Polychronopoulos N.D., Tanifuji S., Peter Muller J. (2012).
Examiner's Answer to Appeal Brief of U.S. Appl. No. 16/748,846 (dated Dec. 20, 2021).
Notice of Allowance of JP2020-210267 (dated Jan. 11, 2022).
Notice of Cancellation Grounds of KR10-2020-0044558 (dated Dec. 27, 2021).
Third Party Observation of KR10-2020-0128117 (receiving date: Feb. 4, 2022).
Third Party Observation of KR10-2020-0180073 (receiving date: Feb. 22, 2022).
Third Party Observation 2 of JP2020-166621 (receiving date: Mar. 8, 2022).
Third Party Observation of JP2020-210284 (receiving date: Apr. 12, 2022).
Evaluation of the strength of single lap joint by using geomertrical and adhesive color information (2015).
Web page for introduction of kurtosis.
Patent Board Decision of U.S. Appl. No. 16/748,846 (dated Apr. 11, 2022).
Examination Report of U.S. Appl. No. 17/012,105 (dated Mar. 11, 2022).
Third Party Observation 1 of JP2020-166621 (receiving date: Mar. 8, 2022) Yes.
Third Party Observation 2 of JP2020-166621 (receiving date: Mar. 8, 2022) No.
Third Party Observation of JP2020-210284 (receiving date: Apr. 12, 2022) No.
Examination Report of JP2020-199487 (dated Mar. 22, 2022).
Examination Report of JP2020-166621 (dated Apr. 19, 2022).
Final Examination Report of JP2020-210276 (dated Mar. 15, 2022).
Third Party Observation of KR10-2020-1080090 (receiving date: Feb. 22, 2022) Yes.
Notice of Allowance of KR10-2020-0180055 (dated Apr. 14, 2022).
Catalog of Fukuda Metal Foil & Powder Co., Ltd. (2015).
Technical Report of Panasonic Corporation (2011).
Japanese dictionary Kojien 7th edition.
Technical Report of IEICE (1999).
Measures against molding defects in easy extrusion molding (1984).
Web page for Surface Roughness Measurement-Parameters.
The 26th Spring Lecture Meeting of the Electronics Packaging Society (2012).
Convertech, 2001.
Notice of Allowance of TW109144672 (dated Jun. 17, 2021).
Notice of Allowance of TW109144673 (dated Aug. 19, 2021).
Notice of Allowance of TW109144674 (dated May 6, 2021).
Notice of Allowance for Appeal of JP2020-210276 (dated Aug. 2, 2022).
Notice of Allowance of U.S. Appl. No. 17/012,105 (dated Nov. 17, 2022).
Notice of Allowance of U.S. Appl. No. 17/126,413 (dated Nov. 15, 2022).
Notice of Reason of Cancellation of JP2020- 210267 (dated Nov. 15, 2022).
Examination Report of JP2020-199487 (dated Oct. 18, 2022).
Examination Report of JP2020-210284 (dated Aug. 2, 2022).
Examination Report of U.S. Appl. No. 17/012,105 (dated Aug. 5, 2022).
Examination Report of U.S. Appl. No. 17/126,413 (dated Aug. 2, 2022).
Examination Report of U.S. Appl. No. 17/126,431 (dated Oct. 18, 2022).
Examination Report of U.S. Appl. No. 17/502,213 (dated Oct. 6, 2022).
Opposition 1 to JP2020-210267 (receiving date: Sep. 12, 2022) yes.
Opposition 2 to JP2020-210267 (receiving date: Sep. 12, 2022) yes.
Final Examination Report of KR10-2020-0180073 (dated Oct. 29, 2022).
Final Examination Report of U.S. Appl. No. 16/748,846 (dated Aug. 24, 2022).
Third Party Observation of JP2020-199487 (receiving date: Dec. 14, 2021).
Third Party Observation of JP2020-166621 (receiving date: Dec. 6, 2022).
Third Party Observation of U.S. Appl. No. 17/502,213 (receiving date: Aug. 8, 2022).
U.S. Appl. No. 62/952,553, filed Dec. 23, 2019).
Patent Application No. JP2020-105862 (Jun. 22, 2020).
The New Color Science Handbook (Apr. 20, 2011).
Tech &Appli of LCP (Dec. 22, 2009).
Rz, Rku, Ra of examples of JP2020-166621 (Jul. 1, 2021).
Roughness webpage.
NDH5000 Haze Meter Introduction (2007).
LCP applied into LED (Nov. 30, 2011).
Kuraray webpage.
Konica webpage.
JISK7375:2008.
JISK7361-1:1997.
JISK7136:2000.
Geometrical Product Specifications (JISB0601:2013).
Fukuda catalog (Dec. 1, 2019).
Dielectrical characteristic &appli of LCP (Nov. 1, 2015).
Standard Test Method for Haze and Luminous Transmittance of Transparent Plastics (ASTM D1003-00).
ASTM D1003-13 (2021).
5G loss insertion (Aug. 2017).
Geometrical Product Specifications (JISB0601:2001).
Development of multilayer flex substrate with LCP film.
Examination Report of JP2020-166621 (dated Jan. 17, 2023).
Examination Report of U.S. Appl. No. 16/748,846 (dated Jan. 24, 2023).
Examination Report of CN202011494501.1 (dated Jan. 5, 2023).
Examination Report of KR10-2020-0180090 (dated Dec. 21, 2022).
Third Party Observation of JP2020-210284 (receiving date: Jan. 24, 2023).
Notice of Allowance of KR10-2020-0128117 (dated Dec. 28, 2022).
Notice of Allowance of U.S. Appl. No. 17/126,431 (dated Feb. 9, 2023).
Corrected NOA 1 of U.S. Appl. No. 17/012,105 (receiving date: Dec. 23, 2022).
Corrected NOA 2 of U.S. Appl. No. 17/012,105 (receiving date: Jan. 23, 2023).
Corrected NOA 3 of U.S. Appl. No. 17/012,105 (receiving date: Feb. 15, 2023).
Corrected NOA of U.S. Appl. No. 17/126,431 (receiving date: Feb. 17, 2023).
Supplemental NOA 1 of U.S. Appl. No. 17/126,413 (receiving date: Jan. 20, 2023).
Supplemental NOA 2 of U.S. Appl. No. 17/126,413 (receiving date: Feb. 8, 2023).
Supplemental NOA 1 of U.S. Appl. No. 17/126,431 (receiving date: Mar. 1, 2023).
Email related to U.S. Appl. No. 17/012,105 and its brief comment.
Email related to U.S. Appl. No. 17/126,413 and its brief comment.
About the mechanical and electrical properties of polyethylene; published by Tokyo Electric Power Company Holdings, Inc.; Jun. 12, 2018.
The Analysis and Comparison of the Standard Test Methods for Haze of Transparent Mediums, published by Center for Measurement Standards/ITRI, Nov. 20, 2005.
Insertion Loss Comparisons of Common High Frequency PCB Constructions; John Coonrod, Rogers Corporation; published in the IPC APEX EXPO Conference Proceedings; Feb. 20, 2013.
LED light—The different between warm light and cool light, published by Ching Yuang Co. Ltd, webpage <https://yuanglight.com/2498/zh-the-difference-between-warm-white-and-cool-white/>, May 14, 2022.

(56) References Cited

OTHER PUBLICATIONS

Turbidity Meter Haze Meter NDH 5000, published by INCOM, webpage <URL: https://www.incom.co.jp/products/detail.php?company_id=4182&product_id=1178>, Jun. 8, 2017.
New Product Introduction—for Flexible Display, published by Nippon Fine Chemical, webpage <URL: https://www.nipponseika.co.jp/business/nsc/flexible-display/>, Mar. 19, 2022, retrieved from google <https://www.google.com/search?q=inurl%3Ahttps%3A%2F%2Fwww.nipponseika.co.jp%2Fbusiness%2Fnsc%2Fflexible-display%2F&rlz=1C1GCEU_zh-TWTW827TW827&oq=inurl%3Ahttps%3A%2F%2Fwww.nipponseika.co.jp%2Fbusiness%2Fnsc%2Fflexible-display%2F&aqs=chrome..69i57j69i58.38906j0j15&sourceid=chrome&ie=UTF-8&as_qdr=y15> on Apr. 10, 2023.
Examination Report of JP2020-210284 (dated Mar. 14, 2023).
Supplemental NOA 2 of U.S. Appl. No. 17/126,431 (receiving date: Mar. 15, 2023).
Third Party Observation of JP2020-199487 (receiving date: Mar. 22, 2023).
Panasonic FELIOS LCP, published by Panasonic, Jun. 2019.
Examination Report of CN202010073759.8 (dated May 20, 2023).
Examination Report of CN202011494501.1 (dated Jun. 22, 2023).
Examination Report of JP2020-199487 (dated Apr. 25, 2023).
Examination Report of U.S. Appl. No. 17/126,431 (dated May 3, 2023).
Notice of Allowance of JP2020-166621 (dated Jun. 13, 2023).
Supplemental NOA 3 of U.S. Appl. No. 17/126,413 (dated Apr. 20, 2023).
Supplemental NOA 4 of U.S. Appl. No. 17/126,413 (dated Apr. 27, 2023).
Supplemental NOA 5 of U.S. Appl. No. 17/126,413 (dated May 5, 2023).
Supplemental NOA 6 of U.S. Appl. No. 17/126,413 (dated May 22, 2023).
Supplemental NOA 7 of U.S. Appl. No. 17/126,413 (dated Jun. 22, 2023).
Decision for Appeal of KR10-2020-0180073 (issuing date: Jun. 7, 2023).
Decision on Opposition of JP2020-210267 (issuing date: Jun. 23, 2023).
Opinion of Patent Opponent 1 of JP2020-210267 (issuing date: Jun. 23, 2023).
Opinion of Patent Opponent 2 of JP2020-210267 (issuing date: Jun. 23, 2023).
Opposition to JP2020-210276 (issuing date: Mar. 24, 2023).
Notice of Reason of Cancellation of JP2020-210276 (dated Jun. 15, 2023).
Mohammed Alhendi et al., A Comparative Study of Aerosol Jet Printing on Polyimide and Liquid Crystal Polymer Substrates for RF Applications, Aug. 5, 2020, published in 2020 IEEE 70th Electronic Components and Technology Conference (ECTC).
Commercialization of Low Transmission Loss Flexible Multilayer Circuit Board Materials, webpage <URL: https://news.panasonic.com/jp/press/jn170117-3>, Jan. 17, 2017, published by Panasonic Holdings Co., Ltd.
Introduction of Roughness, webpage <URL: https://www.keyence.co.jp/ss/products/microscope/roughness/basics/type.jsp>, <URL: https://www.keyence.co.jp/ss/products/microscope/roughness/surface/parameters/sa.jsp> and <URL: https://www.keyence.co.jp/ss/products/microscope/roughness/surface/parameters/sz.jsp>, printed by the opponent of Japanese application No. 2020-210276 on Dec. 28, 2022, published by KEYENCE corporation.
Development trends of high-frequency compatible materials and their application to 5G, Jan. 29, 2019 for first edition; Jun. 7, 2019 for second edition, published by Institute for Technical Information.
Development technology of liquid crystal polymer—High performance and high functionality, Dec. 22, 2009, published by CMC Publishing Co., Ltd.
Electronics Materials for the Ubiquitous Era, Dec. 26, 2003, published by CMC Publishing Co., Ltd.
Information of 4-Hydroxybenzoic Acid, printed by the opponent of Japanese application No. 2020-210276 on Jan. 6, 2023, webpage <URL: https://www.tcichemicals.com/JP/ja/p/H0207>, Dec. 18, 2021, retrieved from Internet Archive <https://web.archive.org/web/20230000000000*/https://www.tcichemicals.com/JP/ja/p/H0207> on Apr. 12, 2023, published by Tokyo Chemical Industry Co., Ltd.
2008 (Gyo-ke) No. 10096 Intellectual Property High Court Judgment, Jan. 28, 2009, published by Intellectual Property High Court.
ISO Home Page for ISO 25178 2:2021, webpage <https://www.iso.org/standard/74591.html>, Dec. 2021, published by International Organization for Standardization.
Data sheet of ULTRALAM3000 Liquid Crystalline Polymer Circuit Material, May 10, 2011, published by Rogers Corporation.
[From light bulb color to daylight color] Explanation of the types of LED colors and their characteristics, webpage <URL: https://greenutility.co.jp/led-light-bulb-color/>, May 24, 2022, Published by Green Utility Co., Ltd.
Precautions for high-speed serial transmission on printed wiring boards, printed by the opponent 1 of Japanese application No. 2020-210267 on Mar. 24, 2023, webpage <URL: https://www.ritael.co.jp/archive/20060401a04/>, Nov. 26, 2019, retrieved from Internet Archive <https://web.archive.org/web/20191201000000*/https://www.ritael.co.jp/archive/20060401a04/> on Jul. 6, 2023, published by RITA Electronics Co., Ltd.
LED Lights: What is the difference between Warm White and Cool White?, webpage <URL: https://www.renovatorstore.com.au/blog/led-lights-what-is-the-difference-between-warm-white-and-cool-white/>, May 29, 2017, published by renovationstore.
What's the difference Between Warm White and Cool White LEDs?, printed by the opponent 2 of Japanese application No. 2020-210267 on Mar. 15, 2023, webpage <URL: https://socketstore.co.uk/page/help/lighting/leds-difference-between-warm-white-and-cool-white>, Oct. 22, 2021, retrieved from Internet Archive <https://web.archive.org/web/20211001000000*/https://socketstore.co.uk/page/help/lighting/leds-difference-between-warm-white-and-cool-white> on Jul. 6, 2023, published by socketstore.
Experience the beauty of warm white LED lighting, printed by the opponent 2 of Japanese application No. 2020-210267 on Mar. 15, 2023, webpage <URL: https://www.lighting.philips.com.my/consumer/led-lights/warm-led-light#slide_Flame_(2200K)>, Sep. 18, 2020, retrieved from Internet Archive <https://web.archive.org/web/20200901000000*/https://www.lighting.philips.com.my/consumer/led-lights/warm-led-light> on Jul. 6, 2023, published by Philips.
White LED: How to make white light?, printed by the opponent 2 of Japanese application No. 2020-210267 on Mar. 13, 2023, webpage <URL: https://www.rohm.co.jp/electronics-basics/led/led_what3>, Jun. 22, 2019, retrieved from Internet Archive <https://web.archive.org/web/20190701000000*/https://www.rohm.co.jp/electronics-basics/led/led_what3> on Jul. 6, 2023, published by Rohm Co., Ltd.
Haze Guard i, printed by the opponent 2 of Japanese application No. 2020-210267 on Mar. 8, 2023, webpage <URL: https://www.tetsutani.co.jp/sokutei/hazegard.html> Aug. 12, 2020, retrieved from Internet Archive <https://web.archive.org/web/20200901000000*/https://www.tetsutani.co.jp/sokutei/hazegard.html> on Jul. 6, 2023, published by Tetsutani & Co., Ltd.
Color temperature exchange filter (La, Lb), printed by the opponent 2 of Japanese application No. 2020-210267 on Mar. 8, 2023, webpage <URL: https://www.hoyacandeo.co.jp/japanese/products/eo/color/06.html>, Oct. 14, 2018, retrieved from Internet Archive <https://web.archive.org/web/20181101000000*/https://www.hoyacandeo.co.jp/english/products/eo/color/06.html> on Jul. 6, 2023, published by Hoya Group Optics Division.
IPC-TM-650 test methods manual, Apr. 2014, published by IPC International, Inc.
Final Examination Report of U.S. Appl. No. 16/748,846 (dated Jul. 12, 2023).
Decision on Opposition of JP2020-21487 (issuing date: Sep. 13, 2021).
Supplemental NOA 1 of U.S. Appl. No. 17/126,413 (dated Jul. 27, 2023).
Examination Report of CN202011494479.0 (dated Aug. 1, 2023).
Examination Report of CN202011498748.0 (dated Aug. 5, 2023).

(56) References Cited

OTHER PUBLICATIONS

Notice of Allowance of U.S. Appl. No. 17/126,431 (dated Aug. 8, 2023).
Supplemental NOA 2 of U.S. Appl. No. 17/126,413 (dated Aug. 28, 2023).
Supplemental NOA 3 of U.S. Appl. No. 17/126,413 (dated Aug. 30, 2023).
Notice of Allowance of CN202011494501.1 (dated Aug. 30, 2023).
Notice of Allowance of KR10-2020-0180090 (dated Aug. 31, 2023).
Ra changes when the cutoff changes, webpage <URL: https://michmet.com/ra-changes-when-the-cutoff-changes/>, Aug. 9, 2022, retrieved from Internet Archive < https://web.archive.org/web/20220815000000*/https://michmet.com/ra-changes-when-the-cutoff-changes/> on Sep. 8, 2023, published by Michigan Metrology, LLC.
Notice of Allowance of JP2020-210284 (dated Oct. 3, 2023).
Supplemental NOA of U.S. Appl. No. 17/126,413 (dated Oct. 4, 2023).
Supplemental NOA of U.S. Appl. No. 17/126,431 (dated Oct. 4, 2023).
Notice of Allowance of JP2020-199487 (dated Oct. 10, 2023).
Supplemental NOA of U.S. Appl. No. 17/126,413 (dated Oct. 27, 2023).
Supplemental NOA of U.S. Appl. No. 17/126,431 (dated Nov. 6, 2023).
Notice of Grounds for Revocation of JP7125468 (issuing date: Dec. 19, 2023).
Opinion of Patent Opponent of JP7125468 (dated Dec. 19, 2023).
Chemical Machining by Ferric Chloride Etchant, Ryuji Ueda (Toppan Printing Co., Ltd.), published by Boshoku Gijutsu, 38, 213-237 (Apr. 15, 1989), attached with the Opinion of Patent Opponent of JP7125468.
Electroless Copper Plating on Liquid Crystal Polymer Films, Koji Umehara et. al, published by Electronics Packaging Society Journal, vol. 7 No. 4, 328-332 (Jul. 1, 2004), attached with the Opinion of Patent Opponent of JP7125468.
1 Enclosures Catalogue Edition 5, publish by ALLBRO, webpage <URL: https://www.allbro.com/download-catalogue/enclosures.pdf>, Oct. 28, 2020, retrieved from Internet Archive <https://web.archive.org/web/20201101000000*/https://www.allbro.com/download-catalogue/enclosures.pdf> on Dec. 26, 2023, attached with the Opinion of Patent Opponent of JP7125468.
Examination Report of CN202010073759.8 (dated Jan. 19, 2024).

* cited by examiner

LIQUID CRYSTAL POLYMER FILM AND LAMINATE COMPRISING THE SAME

CROSS-REFERENCE TO RELATED APPLICATION

Pursuant to 35 U.S.C. § 119(e), this application claims the benefits of the priority to U.S. Provisional Patent Application No. 62/952,553, filed Dec. 23, 2019. The contents of the prior application are incorporated herein by its entirety.

BACKGROUND OF THE INVENTION

Field of the Invention

The present application relates to a polymer film, more particularly to a liquid crystal polymer (LCP) film and a laminate comprising the same.

Description of the Prior Arts

The rapid development of mobile communication technology has pushed the telecom industry to actively develop the fifth generation mobile networks, abbreviated as 5G, so as to optimize the performances, such as the data transmission rate, the response time, and the system capacity, etc. of the fourth generation mobile networks (4G).

Since 5G communication technology uses high-frequency bands for signal transmission, the higher the frequency of the signal, the greater the signal attenuation, signal distortion and insertion loss during signal transmission. In order to achieve signal transmission using high-frequency bands, an LCP film with low moisture absorption and relatively low dielectric properties is chosen to replace a polyimide film (PI film) with hygroscopic and relatively high dielectric properties and stacked with a metal foil to produce a laminate.

However, current products fail to meet the needs of the advanced technology. Researchers are actively seeking for various electronic products with superior transmission quality. How to reduce or suppress the insertion loss of laminate becomes a popular research topic.

SUMMARY OF THE INVENTION

In view of this, an objective of the present application is to reduce or suppress the insertion loss of a laminate comprising an LCP film during signal transmission at high frequency, which makes the laminate more applicable to high frequency electronic products.

To achieve the aforementioned objective, one aspect of the present application provides an LCP film. The LCP film has a first surface and a second surface opposite each other, and the first surface has an arithmetical mean height of a surface (Sa) less than 0.32 micrometers (μm).

By controlling the Sa feature of the first surface of the LCP film, the insertion loss of a laminate comprising the LCP film can be reduced or suppressed during signal transmission at high frequency, which makes the laminate applicable to high frequency electronic products (e.g., 5G products).

In one of the embodiments, in addition to the Sa of the first surface of the LCP film, the Sa of the second surface of the LCP film may also be controlled to be less than 0.32 μm. Accordingly, regardless that the LCP film of the present application is stacked to at least one metal foil through either or both of the first surface and the second surface, the use of the LCP film can make the laminate have the advantage of low insertion loss.

Optionally, the Sa of the first surface of the LCP film of the present application may be, but is not limited to, any one of the following values (unit: μm): 0.31, 0.30, 0.29, 0.28, 0.27, 0.26, 0.25, 0.24, 0.23, 0.22, 0.21, 0.20, 0.19, 0.18, 0.17, 0.16, 0.15, 0.14, 0.13, 0.12, 0.11, 0.10, 0.09, 0.08, 0.07, 0.06, 0.05, 0.04, 0.039, 0.038, 0.037, 0.036, 0.035, 0.034, 0.033, 0.032, 0.031, 0.030, 0.029, 0.028. Or, the Sa of the first surface of the LCP film may fall within the ranges between any two of the above values. In one of the embodiments, the Sa of the first surface of the LCP film of the present application may be less than or equal to 0.31 μm. In another embodiment, the Sa of the first surface of the LCP film of the present application may be less than or equal to 0.30 μm. In further another embodiment, the Sa of the first surface of the LCP film of the present application may be less than or equal to 0.29 μm. In still further another embodiment, the Sa of the first surface of the LCP film of the present application may be more than or equal to 0.028 μm. In yet further another embodiment, the Sa of the first surface of the LCP film of the present application may be more than or equal to 0.028 μm and less than or equal to 0.290 μm. In a further additional embodiment, the Sa of the first surface of the LCP film of the present application may be more than or equal to 0.028 and less than or equal to 0.289 μm. In one of the embodiments, the Sa of the first surface and the Sa of the second surface of the LCP film of the present application may both fall within any of the aforementioned ranges. The Sa of the first surface and the Sa of the second surface of the LCP film of the present application may be the same or different as needed. In one of the embodiments, the Sa of the first surface and the Sa of the second surface of the LCP film of the present application are different.

In one of the embodiments, the first surface of the LCP film of the present application may have a maximum height of a surface (Sz) more than or equal to 0.8 μm. Optionally, the Sz of the first surface of the LCP film of the present application may be, but is not limited to, any one of the following values (unit: μm): 0.80, 0.81, 0.82, 0.83, 0.84, 0.85, 0.86, 0.87, 0.88, 0.89, 0.90, 0.91, 0.92, 0.93, 0.94, 0.95, 0.96, 0.97, 0.98, 0.99, 1.00, 1.10, 1.20, 1.30, 1.40, 1.50, 1.60, 1.70, 1.80, 1.90, 2.00, 2.10, 2.20, 2.30, 2.40, 2.50, 2.60, 2.70, 2.80, 2.90, 3.00, 3.10, 3.20, 3.30, 3.40, 3.50, 3.60, 3.70, 3.80, 3.90, 4.00, 4.10, 4.20, 4.30, 4.40, 4.50, 4.60, 4.70, 4.80, 4.90, 5.00, 5.10, 5.20, 5.30, 5.40, 5.50, 5.60, 5.70, 5.80, 5.90, 6.00, 6.10, 6.20, 6.30, 6.40, 6.50, 6.60, 6.70, 6.80, 6.90, 7.00, 7.10, 7.20, 7.21, 7.22, 7.23, 7.24, 7.25, 7.26, 7.27, 7.28, 7.29, 7.30. Or, the Sz of the first surface of the LCP film may fall within the ranges between any two of the above values. Preferably, the Sz of the first surface of the LCP film of the present application may be more than or equal to 0.9 μm; more preferably, the Sz of the first surface of the LCP film of the present application may be more than or equal to 0.92 μm. Accordingly, applying the LCP film to a laminate can have the advantages of low insertion loss and improved peel strength between the LCP film and a metal foil. With these advantages, the problems such as wire detachment during subsequent processing of a laminate can be avoided. In another embodiment, the Sz of the first surface of the LCP film of the present application may be less than or equal to 7.30 μm. In further another embodiment, the Sz of the first surface of the LCP film of the present application may be more than or equal to 0.92 μm and less than or equal to 7.30 μm. In still further another embodiment, the Sz of the first surface of the LCP film of the present application may be more than or equal to 0.921 μm and less than or equal to 7.239 μm. In one of the embodiments, the Sz of the first surface and the Sz of the second surface of the LCP film of the present application may both fall within any of the aforementioned ranges. The Sz of the first surface and the Sz of the second surface of the LCP film of the present application may be the same or different as needed. In one of the embodiments, the Sz of the first surface and the Sz of the second surface of the LCP film of the present application are different.

In accordance with the present application, the LCP film may be produced by an LCP resin, which is commercially available or made from conventional raw materials. In the present application, the LCP resin is not particularly restricted. For example, aromatic or aliphatic hydroxy compounds such as hydroquinone, resorcin, 2,6-naphthalene-diol, ethanediol, 1,4-butanediol, and 1,6-hexanediol; aromatic or aliphatic dicarboxylic acids such as terephthalic acid, isophthalic acid, 2,6-naphthalenedicarboxylic acid, 2-chloroterephthalic acid, and adipic acid; aromatic hydroxy carboxylic acids such as 3-hydroxybenzoic acid, 4-hydroxybenzoic acid, 6-hydroxy-2-naphthalene carboxylic acid, and 4'-hydroxy-4-biphenylcarboxylic acid; aromatic amine compounds such as p-phenylenediamine, 4,4'-diaminobiphenyl, naphthalene-2,6-diamine, 4-aminophenol, 4-amino-3-methyl phenol, and 4-aminobenzoic acid may be used as raw materials to prepare the LCP resin, and the LCP resin is then used to prepare the LCP film of the present application. In one of the embodiments of the present application, 6-hydroxy-2-naphthalene carboxylic acid, 4-hydroxybenzoic acid, and acetyl anhydride (also called acetic anhydride) may be chosen to obtain the LCP resin, which can be used to prepare the LCP film of the present application. In one of the embodiments, the melting point of the LCP resin may be about 250° C. to 360° C.

In one of the embodiments, a person having ordinary skill in the art may add additives such as, but not limited to, lubricants, antioxidants, electrical insulating agents, or fillers during preparation of the LCP film of the present application based on different needs. For example, the applicable additives may be, but are not limited to, polycarbonate, polyamide, polyphenylene sulfide, or polyetheretherketone.

In accordance with the present application, the thickness of the LCP film is not particularly restricted. For example, the thickness of the LCP film may be more than or equal to 10 μm and less than or equal to 500 μm; preferably, the thickness of the LCP film of the present application may be more than or equal to 10 μm and less than or equal to 300 μm; more preferably, the thickness of the LCP film of the present application may be more than or equal to 15 μm and less than or equal to 250 μm; even more preferably, the thickness of the LCP film of the present application may be more than or equal to 15 μm and less than or equal to 200 μm; and further even more preferably, the thickness of the LCP film of the present application may be more than or equal to 20 μm and less than or equal to 200 μm.

To achieve the aforementioned objective, another aspect of the present application also provides a laminate, which comprises a first metal foil and said LCP film. The first metal foil is disposed over the first surface of the LCP film. That is, the first metal foil in the laminate of the present application is stacked onto the first surface of the LCP film.

According to the above, since the first surface of the LCP film has the Sa less than 0.32 μm, the laminate comprising the LCP film has the advantage of low insertion loss, thereby making the laminate applicable to high frequency electronic products.

In one of the embodiments, the laminate of the present application has the LCP film in a thickness of 50 μm, and said laminate can have an insertion loss not more than −3.0 decibels/10 centimeters (dB/10 cm) at a frequency of 10 gigahertz (GHz). Specifically, in one of the embodiments, the laminate of the present application has the LCP film in a thickness of 50 μm, and the insertion loss of said laminate can be controlled to be within −2.8 dB/10 cm and −3.0 dB/10 cm.

In one of the embodiments, the laminate of the present application may further comprise a second metal foil, which is disposed over the second surface of the LCP film. That is, the first metal foil in the laminate of the present application is stacked onto the first surface of the LCP film, and the second metal foil in said laminate is stacked onto the second surface of the LCP film. In this embodiment, when the Sa properties of both of the first surface and the second surface of the LCP film are controlled at the same time, the laminate has the advantage of low insertion loss. Or, when both Sa and Sz properties of the first surface and the second surface are controlled at the same time, the laminate has the advantage of low insertion loss; in addition, the adhesion of the LCP film stacked onto the first metal foil and the adhesion of the LCP film stacked onto the second metal foil are both improved. That is, the peel strength between the LCP film and the first metal foil as well as the peel strength between the LCP film and the second metal foil are both enhanced.

In accordance with the present application, "stacking" is not limited to direct contact; further, it also includes indirect contact. For example, in one of the embodiments of the present application, the first metal foil in the laminate is stacked onto the first surface of the LCP film in a direct contact manner. In another embodiment of the present application, the first metal foil in the laminate is stacked onto the first surface of the LCP film in an indirect contact manner. Specifically, a connection layer may be disposed between the first metal foil and the first surface of the LCP film based on different needs, so that the first metal foil contacts the first surface of the LCP film via the connection layer. The material of the connection layer may be adjusted according to different needs. For example, the material of the connection layer may include nickel, cobalt, chromium, or alloys thereof to provide functions such as thermal resistance, chemical resistance, or electrical resistance. Similarly, the second metal foil in the laminate may also be stacked onto the second surface of the LCP film in a direct or indirect contact manner. In one of the embodiments of the present application, the stacking manner for the LCP film and the first metal foil and the stacking manner for the LCP film and the second metal foil may be the same. In another embodiment, the stacking manner for the LCP film and the first metal foil may be different from that for the LCP film and the second metal foil.

In accordance with the present application, the first metal foil and/or the second metal foil may be, but are not limited to, copper foil, gold foil, silver foil, nickel foil, aluminum foil, stainless steel foil, etc. In one of the embodiments, the first metal foil and the second metal foil are made of different materials. Preferably, the first metal foil and/or the second metal foil may be copper foil, so that the copper foil and the LCP film are stacked to form a copper clad laminate (CCL). In addition, the methods of preparing the first metal foil and/or the second metal foil are not particularly restricted, as long as the methods do not violate the objective of the present application. For example, the metal foil may be produced by, but not limited to, a roll-to-roll method or an electrodeposition method.

In accordance with the present application, the thickness of the first metal foil and/or the second metal foil is not particularly restricted and can be adjusted based on different needs by a person having ordinary skill in the art. For example, in one of the embodiments, the thickness of the first metal foil and/or the second metal foil may independently be more than or equal to 1 μm and less than or equal to 200 μm; preferably, the thickness of the first metal foil and/or the second metal foil may independently be more than or equal to 1 μm and less than or equal to 40 μm; more preferably, the thickness of the first metal foil and/or the second metal foil may independently be more than or equal to 3 μm and less than or equal to 40 μm.

In accordance with the present application, surface treatment of the first metal foil and/or the second metal foil of the present application can be conducted based on different needs by a person having ordinary skill in the art. For example, the surface treatment may be selected from, but not limited to, roughening treatment, acid-base treatment, thermal treatment, degreasing treatment, ultraviolet irradiation treatment, corona discharge treatment, plasma treatment, primer coating treatment, etc.

In accordance with the present application, the roughness of the first metal foil and/or the second metal foil is not particularly restricted and can be adjusted according to different needs by a person having ordinary skill in the art. In one of the embodiments, the ten-point mean roughness (Rz), which is a line roughness, of the first metal foil and/or the Rz of the second metal foil may independently be more than or equal to 0.1 μm and less than or equal to 2.0 μm; preferably, the Rz of the first metal foil and/or the Rz of the second metal foil may independently be more than or equal to 0.1 μm and less than or equal to 1.5 μm. In one of the embodiments, the Rz of the first metal foil and the Rz of the second metal foil may both fall within any of the aforementioned ranges. In one of the embodiments, the Rz of the first metal foil and/or the Rz of the second metal foil may be equal to 1.0 μm. The Rz of the first metal foil and the Rz of the second metal foil may be the same or different as needed. In one of the embodiments, the Rz of the first metal foil and the Rz of the second metal foil are different.

In one of the embodiments, a third metal foil may be additionally provided based on different needs by a person having ordinary skill in the art. The third metal foil may be the same or different from the first metal foil and/or the second metal foil as needed. In one of the embodiments, the Rz of the third metal foil may fall within any of the aforementioned ranges of the Rz of the first metal foil and/or the Rz of the second metal foil. In one of the embodiments, the Rz of the first metal foil, the Rz of the second metal foil, and the Rz of the third metal foil are different.

Preferably, the first metal foil, the second metal foil, and/or the third metal foil may be low profile metal foil, such as low profile copper foil. In one of the embodiments, the Rz of the first metal foil, the second metal foil, and/or the third metal foil may be less than 1.5 μm. In another embodiment, the Rz of the first metal foil, the second metal foil, and/or the third metal foil may be equal to 1.0 μm.

In one of the embodiments, the laminate may comprise multiple LCP films. Based on the premise of not violating the spirit of the present application, multiple LCP films of the present application and multiple metal foils, such as the said first metal foil, second metal foil, and/or third metal foil, may be stacked based on different needs to produce a laminate having the multiple LCP films and the multiple metal foils by a person having ordinary skill in the art.

In the present specification, "arithmetical mean height of a surface" (Sa) and "maximum height of a surface" (Sz) are area roughness defined by ISO 25178:2012. A person having ordinary skill in the art should understand that the description of area roughness for a specific surface is different from that of line roughness of said specific surface. Area roughness and line roughness cannot be deduced from each other. For example, an Sa cannot be deduced from an arithmetic mean roughness (Ra) evaluated from a roughness profile, and vice versa. Additionally, an Sz cannot be deduced from a ten-point mean roughness (Rz) evaluated from a roughness profile, and vice versa.

DETAILED DESCRIPTION OF THE PREFERRED EMBODIMENTS

Hereinafter, multiple preparation examples are provided to illustrate raw materials used to produce the LCP film of the present application. Multiple examples are further provided to illustrate the implementation of the LCP film and the laminate of the present application, while multiple comparative examples are provided as comparison. A person having ordinary skill in the art can easily realize the advantages and effects of the present application from the following examples and comparative examples. The descriptions proposed herein are just preferable embodiments for the purpose of illustrations only, not intended to limit the scope of the present application. Various modifications and variations could be made in order to practice or apply the present application without departing from the spirit and scope of the present application.

(LCP Resin)

Preparation Example: LCP Resin

A mixture of 6-hydroxy-2-naphthalene carboxylic acid (440 g), 4-hydroxybenzoic acid (1145 g), acetyl anhydride (1085 g), and sodium phosphite (1.3 g) was charged into a 3-liter autoclave and stirred for acetylation at 160° C. for about 2 hours under nitrogen atmosphere at normal pressure. Subsequently, the mixture was heated to 320° C. at a heating rate of 30° C. per hour, and then under this temperature condition, the pressure was reduced slowly from 760 torr to 3 torr or below, and the temperature was increased from 320° C. to 340° C. Afterwards, the stirring power and the pressure were increased, and steps of discharging polymers, drawing strands, and cutting strands into pellets were conducted to obtain an LCP resin having a melting point about 305° C. and a viscosity about 40 Pa·s @320° C.

(LCP Film)

Examples 1 to 12 and Comparative Examples 1 to 5: LCP Films

The LCP resin obtained from Preparation Example was used as raw materials to prepare LCP films of Examples 1 to 12 (E1 to E12) and Comparative Examples 1 to 5 (C1 to C5) by the methods described below.

First, the LCP resin was put into an extruder having a screw diameter of 27 millimeters (mm) (manufacturer: Leistritz, model: ZSE27) and heated to a temperature ranging from 300° C. to 330° C., and then extruded from a T-die having a temperature ranging from 300° C. to 330° C. and a width of 500 mm at a feeding speed ranging from 5.5 kilograms per hour (kg/hr) to 9.5 kg/hr. The LCP resin was then delivered to a space between two casting wheels, which were spaced from the T-die by about 5 mm to 40 mm and each had a temperature ranging from about 290° C. to 330° C. and a diameter ranging from about 35 centimeters (cm) to 45 cm, extruded with a force about 20 kilonewtons (kN) to 60 kN, and then transferred to a cooling wheel for cooling at room temperature, so as to obtain an LCP film having a thickness of 50 μm and a melting point about 250° C. to 360° C.

The parameters of Examples 1 to 12 and Comparative Examples 1 to 5 are listed in Table 1 below. The processes of Examples 1 to 12 differ from those of Comparative Examples 1 to 5 in the distance from the T-die to the surfaces of the casting wheels, the feeding speed, and the temperature of the extruder.

TABLE 1 parameters of preparing LCP films of Examples 1 to 12 and Comparative Examples 1 to 5

| | Preparation parameter | | |
|---|---|---|---|
| Sample No. | Distance from the T-die to the surfaces of the casting wheels (mm) | Feeding speed (kg/hr) | Temperature of the extruder (° C.) |
| E1 | 10 | 6.5 | 305 |
| E2 | 10 | 7.5 | 310 |
| E3 | 10 | 8.5 | 315 |
| E4 | 20 | 5.5 | 300 |
| E5 | 20 | 6.5 | 305 |
| E6 | 20 | 7.5 | 310 |
| E7 | 20 | 8.5 | 315 |
| E8 | 20 | 8.5 | 320 |
| E9 | 5 | 5.5 | 310 |
| E10 | 5 | 6.5 | 315 |
| E11 | 5 | 7.5 | 320 |
| E12 | 10 | 8.5 | 325 |
| C1 | 40 | 5.5 | 305 |
| C2 | 40 | 6.5 | 310 |
| C3 | 40 | 7.5 | 315 |
| C4 | 40 | 8.5 | 320 |
| C5 | 40 | 9.5 | 330 |

The above-mentioned preparation method of LCP film is only used to exemplify implementation of the present application. A person having ordinary skill in the art may adopt conventional methods such as a laminate extension method, an inflation method, and a solvent casting method to prepare an LCP film.

In one of the embodiments, after the LCP resin is extruded from the T-die, the LCP resin may be delivered with two high-temperature resistant films to a space between two casting wheels to form a three-layered laminate based on needs by a person having ordinary skill in the art. The two high-temperature resistant films are detached from the LCP resin at room temperature to obtain the LCP film of the present application. It should be understood that the diameters of the casting wheels are not particularly restricted. The high-temperature resistant films may be selected from, but not limited to, poly(tetrafluoroethene) (PTFE) film, polyimide (PI) film, and poly(ether sulfone) (PES) film.

In addition, post treatments for the obtained LCP film may be conducted based on different needs by a person having ordinary skill in the art. The post treatments may be, but are not limited to, polishing, ultraviolet irradiation, heating, plasma, etc. For the plasma treatment, it may be applied with a plasma operated with a power of 1 kilowatt (kW) under nitrogen, oxygen, or air atmosphere at a reduced or normal pressure (1 atm) based on different needs by a person having ordinary skill in the art, but is not limited thereto.

Test Example 1: Area Roughness of LCP Films

In this test example, the LCP films of Examples 1 to 12 and Comparative Examples 1 to 5 were used as test samples. The area roughness, i.e., Sa and Sz, of either surface of each test sample was measured according to ISO 25178:2012.

In order to measure Sa and Sz of each test sample, the surface morphology images of the test samples were taken by using a laser confocal scanning microscope (manufacturer: Olympus, model: LEXT OLS5000-SAF, objective lens: MPLAPON-50×LEXT) with an objective lens having a magnification power of 50×, 1.0× optical zoom, and a 405 nanometers (nm) wavelength of light source at a temperature of 24±3° C. and a relative humidity of 63±3%. Afterwards, Sa and Sz of the test samples were measured with a resolution of 1024 pixels×1024 pixels and a mode of auto tilt removal.

According to the said method, the results of Sa and Sz of either surface of each LCP film of E1 to E12 and C1 to C5 are listed in Table 2 below.

TABLE 2

Sa and Sz of each LCP film of Examples 1 to 12 and Comparative Examples 1 to 5

| | Sa (μm) | Sz (μm) |
|---|---|---|
| E1 | 0.098 | 4.856 |
| E2 | 0.058 | 2.347 |
| E3 | 0.043 | 1.602 |
| E4 | 0.289 | 7.239 |
| E5 | 0.195 | 5.609 |
| E6 | 0.187 | 2.591 |
| E7 | 0.179 | 1.806 |
| E8 | 0.164 | 1.334 |
| E9 | 0.051 | 4.386 |
| E10 | 0.028 | 1.402 |
| E11 | 0.036 | 0.921 |
| E12 | 0.037 | 0.864 |
| C1 | 0.441 | 5.826 |
| C2 | 0.437 | 3.186 |
| C3 | 0.426 | 2.394 |
| C4 | 0.396 | 1.535 |
| C5 | 0.320 | 0.893 |

As shown in Table 2, the Sa of either surface of each LCP film of E1 to E12 was less than 0.32 μm, but the Sa of either surface of each LCP film of C1 to C5 was more than or equal to 0.32 μm. Regarding the LCP films of E1 to E12, in addition to the Sa less than 0.32 μm, the Sz of either surface of each LCP film of E1 to E12 was more than or equal to 0.8 μm. That is, either surface of each LCP film of E1 to E12 had both characteristics of (1) Sa less than 0.32 μm and (2) Sz more than or equal to 0.8 μm.

Test Example 2: Comparison Between Ra and Sa Properties of LCP Films

To investigate the difference between line roughness (e.g., Ra) and surface roughness (e.g., Sa), the LCP films of E5, E6, and C5 were randomly selected as the test samples from the foresaid examples and comparative examples. According to JIS B 0601:1994, the line roughness of either surface of said LCP films were obtained. Additionally, according to ISO 25178:2012, the area roughness of either surface of said LCP films were obtained.

In order to measure Ra of either surface of the LCP films of E5, E6, and C5, the surface morphology images of the test samples were taken by using a laser confocal scanning microscope (manufacturer: Olympus, model: LEXT OLS5000-SAF, objective lens: MPLAPON-50×LEXT) with an objective lens having a magnification power of 50×, 10× optical zoom, and a 405 nm wavelength of light source at a temperature of 24±3° C. and a relative humidity of 63±3%. Afterwards, Ra of the test samples were measured with a selection of an evaluation length of 4 mm and a cutoff value of 0.8 mm. Results are listed in Table 3 below.

In the test example, the measurement method of area roughness was the same as Test Example 1. The results are the same as Table 2 above. To investigate the difference between Ra and Sa, in addition to Ra, the Sa of the LCP films of E5, E6, and C5 are listed together in Table 3 below.

TABLE 3

Ra and Sa of the LCP films of Examples 5 to 6, and Comparative Example 5

|    | Ra (μm) | Sa (μm) |
|----|---------|---------|
| E5 | 0.086   | 0.195   |
| E6 | 0.089   | 0.187   |
| C5 | 0.096   | 0.320   |

As shown in Table 3 above, the Ra and Sa of the three LCP films were ranked as follows.

Ra: E5<E6<C5.
Sa: E6<E5<C5.

The relationship of increasing order in Ra of multiple LCP films was obviously different from the relationship of increasing order in Sa of multiple LCP films, which showed that Ra and Sa cannot be directly deduced from each other. Further, the difference of Ra or Sa was investigated by relative magnification deduced from maximum value and minimum value of these three LCP films. The Ra of the LCP film of C5 (maximum Ra among these three samples) was close to the Ra of the LCP film of E5 (minimum Ra among these three samples), but the Sa of the LCP film of C5 (maximum Sa among these three samples) was about 1.7 times more than the Sa of the LCP film of E6 (minimum Sa among these three samples). As shown by the results, although the Ra of the LCP films of E5 and C5 were close, the difference of Sa between E5 and C5 was still significant. The results proved that Ra and Sa cannot be directly deduced from each other.

Text Example 3: Comparison Between Rz and Sz of LCP Films

To investigate the difference between line roughness (e.g., Rz) and area roughness (e.g., Sz), the LCP films of E1 and E12 were randomly selected as the test samples from the foresaid examples. According to JIS B 0601:1994, the line roughness of either surface of said LCP films was obtained. Additionally, according to ISO 25178:2012, the area roughness of either surface of said LCP films was obtained.

In order to measure Rz of either surface of the LCP films of E1 and E12, the surface morphology images of the test samples were taken by using a laser confocal scanning microscope (manufacturer: Olympus, model: LEXT OLS5000-SAF, objective lens: MPLAPON-50×LEXT) with an objective lens having a magnification power of 50×, 10× optical zoom, and a 405 nm wavelength of light source at a temperature of 24±3° C. and a relative humidity of 63±3%. Afterwards, Rz of the test samples were measured with a selection of an evaluation length of 4 mm and a cutoff value of 0.8 mm. Results are listed in Table 4 below.

In this test example, the measurement method of area roughness was the same as said Test Example 1. The results are the same as Table 2 above. To investigate the difference between Rz and Sz, in addition to Rz, the Sz of the LCP films of E1 and E12 are listed together in Table 4 below.

TABLE 4

Rz and Sz of the LCP films of Examples 1 and 12

|     | Rz (μm) | Sz (μm) |
|-----|---------|---------|
| E1  | 1.406   | 4.856   |
| E12 | 1.804   | 0.864   |

As shown in Table 4 above, the Rz of the LCP film of E1 was less than the Rz of the LCP film of E12, but the Sz of the LCP film of E1 was more than the Sz of the LCP film of E12, which showed that Rz and Sz cannot be directly deduced from each other. Moreover, either the difference of Ra or the difference of Sa between E1 and E12 was investigated by relative magnification. The Rz of the LCP film of E12 was only about 1.3 times more than the Rz of the LCP film of E1, but the Sz of the LCP film of E1 was about 5.6 times more than the Sz of the LCP film of E12. As shown by the results, although the Rz of the LCP films of E1 and E12 were close, the difference of Sz between E1 and E12 was still significant. The results proved that Rz and Sz cannot be directly deduced from each other.

According to Test Examples 2 and 3, line roughness and area roughness were obviously different. A person having ordinary skill in the art cannot expect or deduce area roughness of the LCP film based on line roughness of the LCP film. Specifically, a person having ordinary skill in the art cannot expect or deduce Sa of LCP film based on Ra of the LCP film, Sz of LCP film based on Rz of the LCP film, and vice versa.

(Laminate))

Examples 1A to 12A and Comparative Examples 1A to 5A: Laminates

Laminates of Examples 1A to 12A (E1A to E12A) and Comparative Examples 1A to 5A (C1A to C5A) were respectively produced from the LCP films of Examples 1 to 12 and Comparative Examples 1 to 5 stacked to the same kind of commercially available copper foil.

Specifically, the LCP film having a thickness about 50 μm and two identical copper foils each having a thickness about 12 μm were each first cut to a size of 20 cm×20 cm. The LCP film was then sandwiched between the two commercially available copper foils to form a laminated structure. The laminated structure was subjected to a pressure of 5 kilograms per square centimeter (kg/cm$^2$) for 60 seconds at 180° C., followed by a pressure of 20 kg/cm$^2$ for 25 minutes (min) at 300° C., and then cooled to room temperature to obtain a laminate. The LCP films contained in each laminate are listed in Table 5 below.

Herein, the lamination method for the laminates is not particularly restricted. A person having ordinary skill in the art may use conventional techniques such as a wire lamination or a surface lamination to conduct the lamination process. A laminator applicable to the present application may be, but is not limited to, an intermittent hot-press machine, a roll-to-roll wheeling machine, a double belt press machine, etc. According to different needs, a person having ordinary skill in the art can also align the LCP film with the copper foils to form a laminated structure, which may then be processed with surface lamination comprising a heating step and a pressing step.

In another embodiment, a metal foil, such as a copper foil, on an LCP film may be formed through sputtering, electroplating, chemical plating, evaporation deposition, etc. based on different needs by a person having ordinary skill in the art. Or, a connection layer, such as a glue layer, a nickel layer, a cobalt layer, a chromium layer, or an alloy layer thereof, may be formed between an LCP film and a metal foil based on different needs by a person having ordinary skill in the art.

Test Example 4: Insertion Loss of Laminate

The laminates of Examples 1A to 12A and Comparative Examples 1A to 5A were each cut to a size of a length about 10 cm, a width about 140 μm, and a resistance about 50 Ohm (Ω) as strip line specimens. The insertion loss of the strip line specimens were measured under 10 GHz by a microwave network analyzer (manufacturer: Agilent Technologies, Ltd., model: 8722ES) including a probe (manufacturer: Cascade Microtech, model: ACP40-250). The results of the laminates are listed in Table 5 below.

TABLE 5

Sa of the LCP films of Examples 1 to 12 and Comparative Examples 1 to 5 and insertion loss of the laminates of Examples 1A to 12A and Comparative Examples 1A to 5A (@ 10 GHz)

| | LCP film | | Laminate | |
|---|---|---|---|---|
| | Sample No. | Sa (μm) | Sample No. | Insertion loss (dB/10 cm) |
| 1 | E1 | 0.098 | E1A | −2.9 |
| 2 | E2 | 0.058 | E2A | −2.9 |
| 3 | E3 | 0.043 | E3A | −2.8 |
| 4 | E4 | 0.289 | E4A | −3.0 |
| 5 | E5 | 0.195 | E5A | −3.0 |
| 6 | E6 | 0.187 | E6A | −3.0 |
| 7 | E7 | 0.179 | E7A | −3.0 |
| 8 | E8 | 0.164 | E8A | −2.9 |
| 9 | E9 | 0.051 | E9A | −2.9 |
| 10 | E10 | 0.028 | E10A | −2.8 |
| 11 | E11 | 0.036 | E11A | −2.9 |
| 12 | E12 | 0.037 | E12A | −2.8 |
| 13 | C1 | 0.441 | C1A | −3.2 |
| 14 | C2 | 0.437 | C2A | −3.1 |
| 15 | C3 | 0.426 | C3A | −3.1 |
| 16 | C4 | 0.396 | C4A | −3.1 |
| 17 | C5 | 0.320 | C5A | −3.1 |

As shown in Table 5 above, since Sa of either surface of the LCP films of E1 to E12 were less than 0.32 μm, the insertion loss of the laminates (E1A to E12A) comprising said LCP films and commercially available copper foils could be controlled to be less than or equal to −3.0 dB/10 cm. That is, said insertion loss could be more than or equal to −2.8 dB/10 cm and less than or equal to −3.0 dB/10 cm. In contrast, since Sa of either surface of the LCP films of C1 to C5 were more than or equal to 0.32 μm, the insertion loss of the laminates of C1A to C5A were more than or equal to −3.1 dB/10 cm. Especially, Sa of either surface of the LCP film of C1 was 0.441 μm, which made the insertion loss of the laminate of C1A to be −3.2 dB/10 cm. Said laminate could not meet the need of high transmission quality of electronic products for the telecom industry.

As shown by the results, controlling the Sa of either surface of the LCP film to be less than 0.32 μm could reduce the insertion loss of a laminate, which improved the performance of the laminate when applied to electronic products.

Test Example 5: Peel Strength of Laminates

The peel strength of the laminates was measured according to IPC-TM-650 No.: 2.4.9. The laminates of Examples 1A to 12A and Comparative Examples 1A to 5A were each cut to a size of a length about 228.6 mm and a width about 3.2 mm as etched specimens. Each etched specimen was placed at a temperature of 23±2° C. and a relative humidity of 50±5% for 24 hours to reach stabilization. Subsequently, each etched specimen was adhered to a clamp of a testing machine (manufacturer: Hung Ta Instrument Co., Ltd., model: HT-9102) with a double faced adhesive tape. Each etched specimen was then peeled from the clamp with a force at a peel speed of 50.8 mm/min, and the value of the force during the peeling process was continuously recorded. Herein, the force should be controlled within a range of 15% to 85% of the bearable force of the testing machine, the peeling distance from the clamp should be at least more than 57.2 mm, and the force for the initial distance of 6.4 mm was neglected and not recorded. The results are shown in Table 6.

TABLE 6

Sa and Sz of the LCP films of Examples 1 to 12 and Comparative Examples 1 to 5 as well as the insertion loss and peel strength of the laminates of Examples 1A to 12A and Comparative Examples 1A to 5 A

| | LCP film | | | Laminate | | |
|---|---|---|---|---|---|---|
| | Sample No. | Sa (μm) | Sz (μm) | Sample No. | Insertion loss (dB/10 cm) | Peel strength (kN/m) |
| 1 | E1 | 0.098 | 4.856 | E1A | −2.9 | 1.26 |
| 2 | E2 | 0.058 | 2.347 | E2A | −2.9 | 1.18 |
| 3 | E3 | 0.043 | 1.602 | E3A | −2.8 | 1.13 |
| 4 | E4 | 0.289 | 7.239 | E4A | −3.0 | 1.28 |
| 5 | E5 | 0.195 | 5.609 | E5A | −3.0 | 1.23 |
| 6 | E6 | 0.187 | 2.591 | E6A | −3.0 | 1.18 |
| 7 | E7 | 0.179 | 1.806 | E7A | −3.0 | 1.12 |
| 8 | E8 | 0.164 | 1.334 | E8A | −2.9 | 1.08 |
| 9 | E9 | 0.051 | 4.386 | E9A | −2.9 | 1.23 |
| 10 | E10 | 0.028 | 1.402 | E10A | −2.8 | 1.14 |
| 11 | E11 | 0.036 | 0.921 | E11A | −2.9 | 1.06 |
| 12 | E12 | 0.037 | 0.864 | E12A | −2.8 | 0.98 |
| 13 | C1 | 0.441 | 5.826 | C1A | −3.2 | 1.24 |
| 14 | C2 | 0.437 | 3.186 | C2A | −3.1 | 1.19 |
| 15 | C3 | 0.426 | 2.394 | C3A | −3.1 | 1.18 |
| 16 | C4 | 0.396 | 1.535 | C4A | −3.1 | 1.14 |
| 17 | C5 | 0.320 | 0.893 | C5A | −3.1 | 0.96 |

As shown in Table 6 above, the difference of the performance of the laminates of E1A to E11A between the performance of the laminates of E12A and C1A to C5A was obvious. Since either surface of the LCP films of E1 to E11 had both characteristics of (1) Sa less than 0.32 μm, and (2) Sz more than or equal to 0.9 μm, the laminates comprising copper foils and the LCP films of E1 to E11 had the advantages of low insertion loss (less than or equal to −3.0 dB/10 cm) and improved peel strength between an LCP film and a copper foil more than or equal to 1.0 kN/m. Accordingly, in addition to Sa of the LCP film, proper Sz of the LCP film could further optimize the lamination of the LCP film and copper foil, and thus the laminate exhibiting both high peel strength and low insertion loss could be obtained.

In summary, by controlling the Sa of the first surface of the LCP film to be less than 0.32 μm, the insertion loss of the laminate comprising said LCP film can be reduced or suppressed. Therefore, the laminate of the present application is applicable to advanced high frequency products.

What is claimed is:

1. A liquid crystal polymer film, comprising a first surface and a second surface opposite each other, wherein the first surface has an arithmetical mean height of a surface (Sa) less than 0.32 μm and a maximum height of a surface (Sz) more than or equal to 1.10 μm.

2. The liquid crystal polymer film as claimed in claim 1, wherein the Sa of the first surface is less than or equal to 0.31 μm.

3. The liquid crystal polymer film as claimed in claim 1, wherein the Sa of the first surface is less than or equal to 0.30 μm.

4. The liquid crystal polymer film as claimed in claim 1, wherein the Sa of the first surface is less than or equal to 0.29 μm.

5. The liquid crystal polymer film as claimed in claim 1, wherein the Sa of the first surface is more than or equal to 0.028 μm and less than 0.32 μm.

6. The liquid crystal polymer film as claimed in claim 1, wherein the Sa of the first surface is more than or equal to 0.028 μm and less than or equal to 0.290 μm.

7. The liquid crystal polymer film as claimed in claim 1, wherein the Sa of the first surface is more than or equal to 0.028 μm and less than or equal to 0.289 μm.

8. The liquid crystal polymer film as claimed in claim 1, wherein the Sz of the first surface is more than or equal to 1.10 μm and less than or equal to 7.30 μm.

9. The liquid crystal polymer film as claimed in claim 8, wherein the Sz of the first surface is more than or equal to 1.10 μm and less than or equal to 7.239 μm.

10. The liquid crystal polymer film as claimed in claim 1, wherein the second surface has an Sa less than 0.32 μm.

11. The liquid crystal polymer film as claimed in claim 1, wherein the second surface has an Sz more than or equal to 0.8 μm.

12. A laminate, comprising a first metal foil and the liquid crystal polymer film as claimed in claim 1, the first metal foil disposed over the first surface of the liquid crystal polymer film.

13. The laminate as claimed in claim 12, wherein the laminate further comprises a second metal foil, and the second metal foil is disposed over the second surface of the liquid crystal polymer film.

* * * * *